United States Patent
Conte et al.

(10) Patent No.: US 8,942,033 B2
(45) Date of Patent: Jan. 27, 2015

(54) DRIVING STAGE FOR PHASE CHANGE NON-VOLATILE MEMORY DEVICES PROVIDED WITH AUTO-CALIBRATION FEATURE

(71) Applicant: STMicroelectronics S.R.L., Agrate Brianza (MB) (IT)

(72) Inventors: Antonino Conte, Tremestieri Etneo (IT); Kailash Khairnar, Catania (IT); FrancescoNino Mammoliti, Riposto (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 64 days.

(21) Appl. No.: 13/774,181

(22) Filed: Feb. 22, 2013

(65) Prior Publication Data

US 2013/0229864 A1    Sep. 5, 2013

(30) Foreign Application Priority Data

Mar. 2, 2012 (IT) .............................. TO2012A0188

(51) Int. Cl.
G11C 11/00 (2006.01)
G11C 13/00 (2006.01)
G11C 5/14 (2006.01)

(52) U.S. Cl.
CPC ............ *G11C 13/0004* (2013.01); *G11C 5/145* (2013.01); *G11C 5/147* (2013.01); *G11C 13/0038* (2013.01); *G11C 13/0069* (2013.01)
USPC ....................................... 365/163; 365/189.05

(58) Field of Classification Search
CPC ................................ G11C 7/22; G11C 13/004
USPC .............................................. 365/163, 189.05
See application file for complete search history.

(56) References Cited

U.S. PATENT DOCUMENTS

2008/0272803 A1*  11/2008  Balasubramanian et al. .. 326/38
2009/0122593 A1    5/2009  Cho et al.
2009/0140973 A1*   6/2009  Kim et al. ..................... 345/102

* cited by examiner

*Primary Examiner* — Michael Tran
(74) *Attorney, Agent, or Firm* — Allen, Dyer, Doppelt, Milbrath & Gilchrist, P.A.

(57) ABSTRACT

A driving stage for a phase change non-volatile memory device may include an output driving unit, which supplies an output driving current during programming of a memory cell, a driving-control unit, which receives an input current and generates a first control signal for controlling supply of the output driving current in such a way that a value thereof has a desired relation with the input current, and a level-shifter element, which carries out a level shift of a voltage of the first control signal for supplying to the output driving unit a second control signal, having a voltage value that is increased with respect to, and is a function of, the first control signal. A calibration unit may carry out an operation of updating of the value of a shift voltage across the level-shifter element, as the value of the input current varies.

28 Claims, 7 Drawing Sheets

DRIVING STAGE FOR PHASE CHANGE NON-VOLATILE MEMORY DEVICES PROVIDED WITH AUTO-CALIBRATION FEATURE

FIELD OF THE DISCLOSURE

The present disclosure relates to a driving stage for a phase change in non-volatile memory devices and for supplying driving currents during operation of programming of the memory cells.

BACKGROUND OF THE DISCLOSURE

Phase change non-volatile memories, so-called embedded Phase change Memories (ePCMs), represent a new generation of integrated memories. In these memories, in order to store information, the characteristic of materials having the property of switching between phases with different electrical characteristics is relied upon. These materials may switch between an amorphous, disorderly, phase and a crystalline or polycrystalline, orderly, phase, and the two phases are associated to resistivities of considerably different value, and consequently to a different value of a stored data. For example, the elements of the VI group of the periodic table, such as tellurium (Te), selenium (Se), or antimony (Sb), referred to as chalcogenides or chalcogenic materials, may be advantageously used for manufacturing phase change memory cells. In particular, an alloy made up of germanium (Ge), antimony (Sb), and tellurium (Te), known as GST (having the chemical composition $Ge_2Sb_2Te_5$), is currently widely used in such memory cells.

The phase changes can be obtained by locally increasing the temperature of the cells made of chalcogenic material, and through resistive electrodes (generally known as heaters) in contact with respective regions of chalcogenic material. Selection devices (for example, MOSFETs) are connected to the heaters and enable passage of a programming electric current through a respective heater. This electric current, by the Joule effect, generates the temperatures necessary for the phase change. In particular, when the chalcogenic material is in the amorphous state, at high resistivity (the so-called RESET state), it may be required to apply a current/voltage pulse (or an appropriate number of current/voltage pulses) of duration and amplitude such as to enable the chalcogenic material to cool slowly. Subjected to this treatment, the chalcogenic material changes its state and switches from the high-resistivity state to a low-resistivity state (the so-called SET state). Vice versa, when the chalcogenic material is in the SET state, it may be required to apply a current/voltage pulse having appropriate duration and high amplitude so as to cause the chalcogenic material to return to the high-resistivity amorphous state.

During reading, the state of the chalcogenic material is detected by applying a voltage sufficiently low as not to cause a sensible heating thereof, and then by reading the value of the current in the memory cell. Given that the current is proportional to the conductivity of the chalcogenic material, it is possible to determine in which state the material is, and consequently determine the data stored in the memory cell. In general, PCMs provide important advantages, amongst which are high scalability and reading speed combined with a reduced current consumption and a high efficiency.

As shown in FIG. 1 (limited in detail, as will be appreciated by those skilled in the art), a non-volatile PCM device 1 comprises a memory array 2 made up of a plurality of memory cells 3, arranged in rows (word lines, WL) and columns (bit lines, BL). Each memory cell 3 comprises a storage element 3a and a selector element 3b, which are connected in series between a respective bit line BL and a terminal at a reference potential (for example, ground, GND). In particular, a word line WL is defined by the set of all the control terminals of the selector elements 3b aligned along one and the same row.

The storage element 3a includes a phase change material (for example, a chalcogenide, such as GST), and is consequently able to store data in the form of resistance levels associated to the different phases assumed by the material. The selector element 3b, as in the embodiment illustrated, may be an NMOS transistor having its gate terminal connected to the word line WL, its drain terminal connected to the storage element 3a, and its source terminal connected to the terminal at reference potential. The selector element 3b is controlled so as to enable, when selected, the passage of a reading/programming driving current through the storage element 3a, during respective reading/programming operations.

A column decoder 4 and a row decoder 5 enable selection, on the basis of address signals received at input and complex decoding schemes of the memory cells 3, of the corresponding word lines WL and bit lines BL. Each time the memory cells are addressed, the biasing thereof is enabled at appropriate voltage and current values by corresponding driving stages. In particular, as shown in FIG. 1, the driving stage 6 supplies the driving currents for the bit lines BL of the memory array 2 during the operations of programming of the SET or RESET states in the memory cells 3.

In particular, it is known that the programming operations, both when programming of the SET state and when programming of the RESET state, of the chalcogenide material of the memory cells 3 envision a supply to the storage elements 3a of current pulses of high value, for the activation of the mechanisms of change of state. Moreover, an accurate control of the parameters of the programming current pulses is critical for ensuring efficient and repeatable transitions between the SET and RESET states, and this control must be ensured in a wide range of values of current so as to deal with the various operating conditions of the memory device 1. For example, a low distortion of the waveform of the driving current pulses may be required in a wide range between 100 µA and 1000 µA (with a maximum voltage generated on the bit lines BL by the column decoder 4 that may reach a value of approximately 3 V, and a voltage on the word lines WL of a value around 2.7 V).

The programmed SET state may undergo shifts of several microamps in the case where the SET current pulse deviates significantly from the optimal, desired, one, and that in general, this deviation should not exceed +/−10% (for example: 200 µA+/−20 µA), taking into account both systematic errors and statistical errors. By way of example, FIGS. 2a and 2b show possible plots of the RESET pulses and of the SET pulses, respectively, for the respective operations of programming of the memory cells 3. It is evident that meeting of the aforesaid stringent requirements in the control of the parameters of the waveforms of the programming current pulses is an aspect that may be addressed in the design of memory devices and that may represent one of the aspects thereof.

FIG. 3 is a driving stage 6 for supplying, during programming operations, output driving currents, here designated by Ik (where k is an index of integer value, for example, ranging between 0 and 31, in the case where the driving stage 6 is connected to thirty-two bit lines BL) designed for biasing the memory cells 3. The output driving currents Ik are supplied to the column decoder 4, so as to subsequently be supplied, according to the decoding schemes implemented, to the bit lines BL of the memory array 2.

In detail, the driving stage 6 comprises a driving-control unit 7 having a low-impedance input receiving an input current Iin of a low value (i.e., sensibly lower than the value required for the output driving currents Ik), for example, equal to 200 μA in the case where the value required for the output driving current Ik is 800 μA, generated by an input stage 8 as a function of the specific required memory operation (for example, having a different value for the SET and RESET programming operations). This input-current-generator stage 8 may be implemented in a wide range of ways, generally depending on the type of application. For example, a digital-to-analog converter (DAC) may be used, whereby a given output current corresponds to a given configuration of a certain number of input bits.

The driving stage 6 further comprises an output driving unit 9 connected to the driving-control unit 7 and designed to generate and distribute to the bit lines the output driving currents Ik. The driving-control unit 7 and the output driving unit 9 are supplied by a charge-pump stage 10, which supplies appropriate supply electrical quantities, in particular, a boosted voltage Vcp in the high-voltage (HV) range (for example, between 4 V and 5 V) of a value higher than the low logic voltages used in the memory device 1 (which are, for example, between 1.08 V and 1.32 V).

The driving-control unit 7 comprises a plurality of control subunits 11, and the output driving unit 9 comprises a respective plurality of driving subunits 12, each of which, appropriately supplied by the charge-pump stage 10, is designed to supply a respective output driving current $1k$, having a value amplified by a factor β with respect to the input current Iin, according to the relation: Ik=Iin·β. The voltages supplied at output by the driving subunits 12 are, for example, approximately 3 V.

In particular, each control subunit 11 drives in an appropriate way a respective set of driving subunits 12, supplying appropriate command signals for enabling supply at output of the respective output driving currents Ik. For example, each control subunit 11 can drive four respective driving subunits 12 (so that in the driving stage eight control subunits 11 may, for example, be present, for supplying thirty-two output driving currents Ik via a corresponding number of driving subunits 12).

As illustrated in FIG. 4 (which depicts, for simplicity of illustration, a single control subunit 11 and the corresponding set of driving subunits 12, illustratively four in number), each control subunit 11 forms, with the corresponding set of driving subunits 12, a current mirror in cascode configuration, designed to mirror on the various outputs the input current Iin with amplification factor R. The control subunit 11 defines the input branch of the current mirror while the driving subunits 12 define respective output branches of the same mirror, connected to one another in parallel.

In more detail, the control subunit 11 comprises a cascode control transistor MCC and an input mirror transistor MPC, both of a PMOS type and connected in series between a first input In1 of the driving stage 6. The driving stage receives the input current Iin, and a second input In2 of the same driving stage is connected to the output of the charge-pump stage 10 and receives the boosted voltage Vcp. The control terminal of the cascode control transistor MCC is connected to a third input 1n3, which receives a cascode biasing voltage Vcascp, of an appropriate value, while the control terminal of the input mirror transistor MPC is connected to the first input In1 and to the respective conduction terminal of the cascode control transistor MCC, so as to provide the diode configuration for the current-mirroring operation.

Each driving subunit 12 (for convenience, an n-th driving subunit 12 is described, but altogether similar considerations apply to the other subunits of the corresponding set, designated by n+1, n+2 and n+3, where n is an integer index representing the set itself) comprises a respective cascode driving transistor MCn and an output mirror transistor MPn, both of a PMOS type and connected in series between the second input In2 and a respective output of the driving stage 6 that supplies the respective output driving current In. The control terminals of the cascode driving transistor MCn and of the output mirror transistor MPn are connected to the control terminals of the cascode control transistor MCC and of the input mirror transistor MPC, respectively.

The circuit configuration described may enable mirroring of the input driving current Iin with the desired amplification factor β, given by the different size ratios (width/length, W/L) of the transistors in the input and output branches. In particular, the cascode configuration may enable a drain-to-source voltage drop Vds to be obtained at the output mirror transistors MPn that is substantially constant, so as to ensure repeatability of the electrical performance. The cascode configuration may enable linearity to be obtained both for the driving-control unit 7 and for the output driving unit 9.

However, the configuration described also may have some limitations that do not enable full exploitation of its advantages. In particular, for reasons of speed and consumption, each control subunit 11 may drive a limited number (for example, three or at the most, as in the case illustrated, four) of driving subunits 12 connected in parallel so that a considerable occupation of area is required for the integrated implementation of the single driving-control unit 7. Moreover, it may be required that all the transistors in the circuit are of the high-voltage type in order to withstand the high voltage values present across their terminals, which, combined with the high requirements of output current, entails the use of transistors of large dimensions, with thick oxides, and high costs, and once again a considerable occupation of space. Given that the entire driving stage 6 is supplied by the charge-pump stage 10, the latter must be sized so as to meet the high current requirements thereof, and in particular the inefficiency of the driving stage 6 itself results in a high consumption of current required of the charge-pump stage 10.

Moreover, the circuit described, in cascode configuration, operates effectively and shows a good linearity when the driving-control unit 7 operates in the high-voltage range in such a way as to ensure a sufficient drain-to-source voltage drop Vds on the output mirror transistors MPn. Instead, it is evident that the cascode configuration has some limitations in the case where the driving-control unit 7 is supplied with low voltages (for example, around the value of a logic supply voltage Vdd of the memory device 1).

SUMMARY OF THE DISCLOSURE

The object of the present disclosure is to provide an approach to the problems highlighted previously, in particular, in regards to driving currents with controlled and repeatable values and of linearity in a wide range of values of the same driving currents.

According to the present embodiments, a driving stage for a phase change non-volatile memory device may comprise an output driving unit configured to supply an output driving current during programming of at least one memory cell of the phase change non-volatile memory device, and a driving-control unit configured to receive an input current, and to generate on a control output a first control signal to control supply of the output driving current by the output driving unit so that a value of the output driving current has a desired relation with the input current. The driving stage may include a level-shifter element between the control output of the driving-control unit and a control input of the output driving unit, and configured to determine a level shift of a voltage of the first control signal for supplying to the control input of the output driving unit a second control signal, the second control signal having a voltage value that is increased with respect to, and is a function of, the first control signal. The driving stage may include a calibration unit configured to cause updating of the value of a shift voltage defined by the level-shifter element as the input current varies.

BRIEF DESCRIPTION OF THE DRAWINGS

For a better understanding of the present embodiments, preferred embodiments thereof are now described, purely by way of non-limiting example, with reference to the attached drawings, wherein.

DETAILED DESCRIPTION

Figure 1:
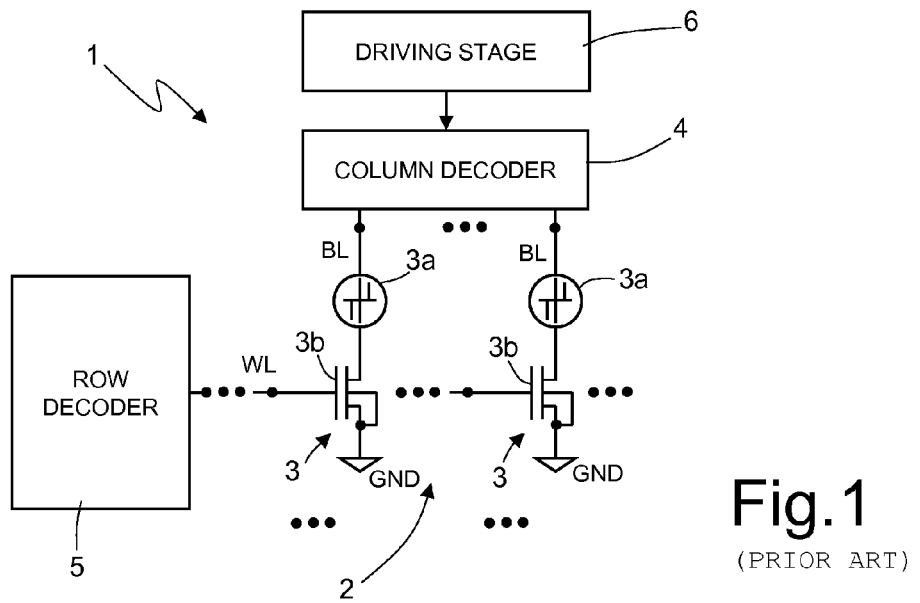
FIG. 1 is a schematic block diagram of a non-volatile PCM device, according to the prior art.
Figure 2A:
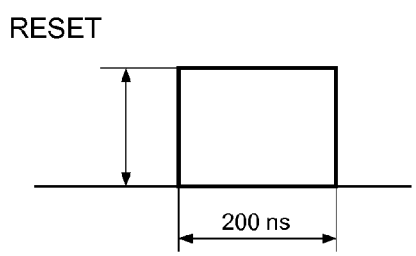
FIGS. 2a and 2b are diagrams of driving-current pulses in different operating conditions for the memory device of FIG. 1.
Figure 2B:
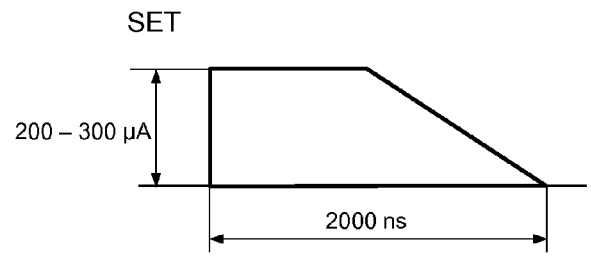
Figure 5:
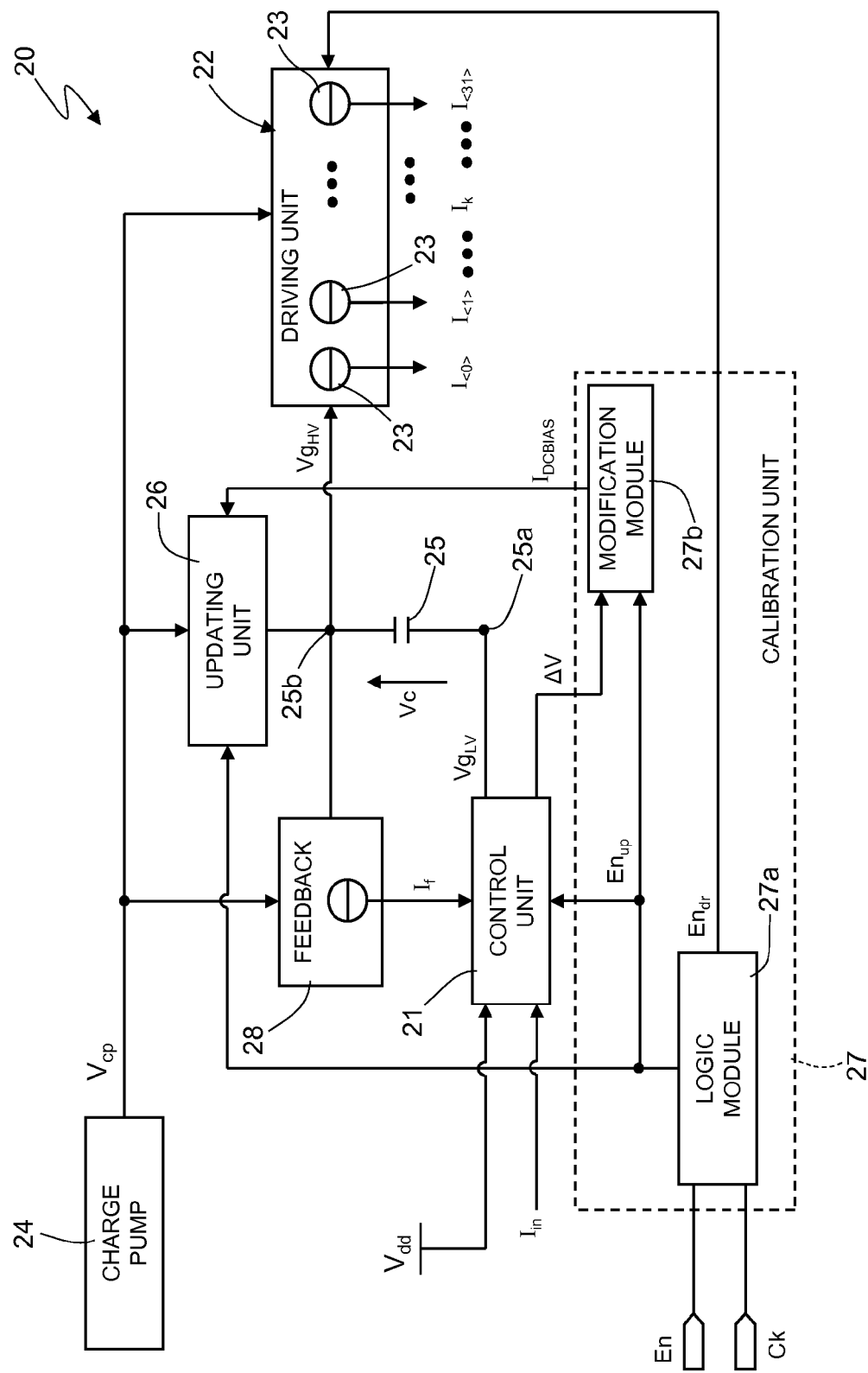
FIG. 5 is a schematic block diagram of a driving stage, according to an embodiment.

As shown in FIG. 5, according to an embodiment, a driving stage for a phase change non-volatile memory device 20 (for example, of the type described in FIG. 1, to which reference is made here, even though it is not described again) comprises: a driving-control unit 21, which receives, on a first low-impedance input, an input current Iin, with appropriate value that is a function of the specific memory operation required, and an output driving unit 22 comprising (in a way substantially similar to what has been illustrated previously) a plurality of driving subunits 23 (and represented schematically as controlled current generators). Each driving subunit is appropriately supplied by a charge-pump stage 24, which provides on a respective output a respective output driving current Ik having a value amplified by a factor β with respect to the input current Iin, according to the relation: Ik=

As will be described in detail hereinafter, in addition to receiving a boosted voltage Vcp from the charge-pump stage 24, the output driving unit 22 receives at an input a high-voltage control signal VgHV, in particular, designed to drive the control terminals of respective output transistors connected to one another in parallel and, each, to a respective output of the output driving unit 22.

Figure 3:
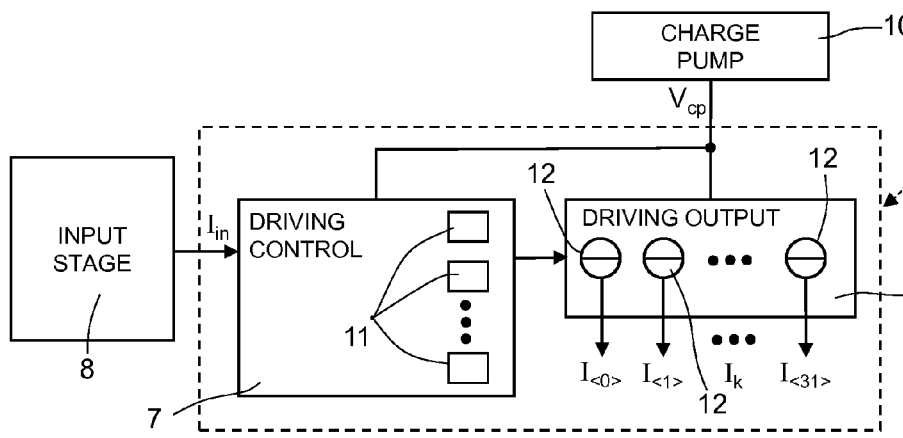
FIG. 3 is a schematic block diagram of a driving stage of the device of FIG. 1.
Figure 4:
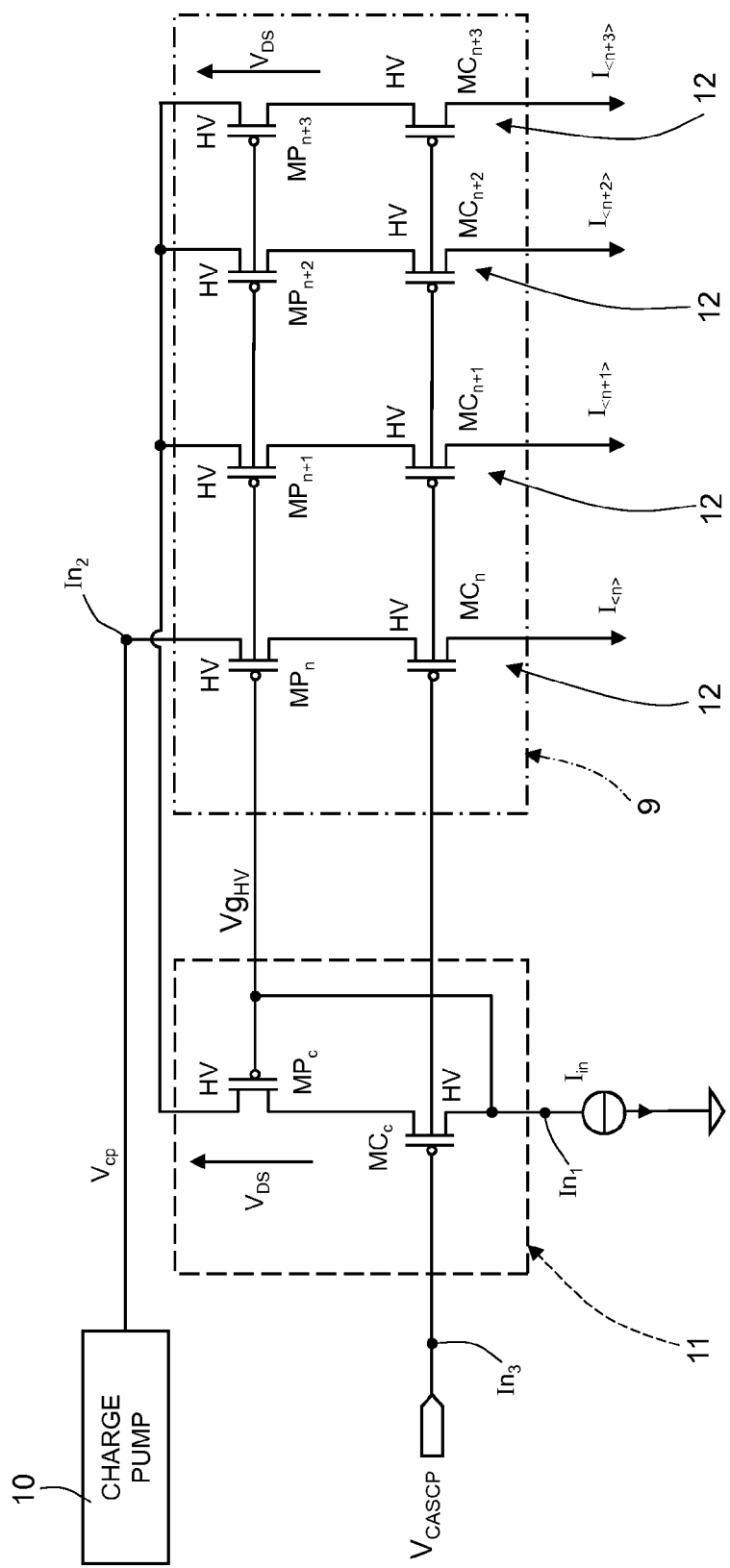
FIG. 4 is a schematic circuit diagram of a portion of the driving stage of FIG. 3.

The driving-control unit 21, instead of being supplied, as in known solutions (for example, as described with reference to FIG. 3), by the charge-pump stage 24, has a supply-voltage input connected to a low-voltage supply source of the memory device 1, which supplies a logic supply voltage VDD, for example, of a value comprised between 1.08 V and 1.32 V. In addition, instead of driving directly the output driving unit 22 (once again as in known approaches), the driving-control unit 21 supplies at output a low-voltage control signal VgLV, which is supplied to a first pin 25a of a level-shifter capacitor 25, of a high-voltage type. A second pin 25b of the same level-shifter capacitor 25 supplies the high-voltage control signal VgHV for the output driving unit 22 with a value equal to the sum of the voltage of the low-voltage control signal VgLV and of the voltage stored on the level-shifter capacitor 25.

In other words, the driving-control unit 21 supplies at an output a control signal in the low-voltage range, which, only after appropriate level shifting performed by the level-shifter capacitor 25 (by addition of a direct current (DC) component), suitably drives the driving subunits 23 connected in parallel to one another at output. In particular, during operation, a shift voltage Vc is accumulated on the level-shifter capacitor 25, having an appropriate value and such that, once added to the low-voltage control signal VgLV, enables generation, through the driving subunits 23 driven by the resulting high-voltage control signal VgHV, of the desired values for the output driving currents Ik.

The driving stage 20 further comprises an updating unit 26 having an output connected to the second pin 25b of the level-shifter capacitor 25 and a supply-voltage input receiving the boosted voltage Vcp from the charge-pump stage 24. As will be described in detail hereinafter, the updating unit 26 moreover receives at an input an update-enable signal Enup, for example, of an impulsive type, and an updating quantity IDCbias, for example, an electric current, and is configured so as to activate, according to the value of the update-enable signal Enup, updating to an appropriate value of the shift voltage Vc on the level-shifter capacitor 25 as a function of the updating quantity IDCbias. The same update-enable signal Enup is moreover supplied at input to the driving-control unit 21.

According to a particular aspect, the driving stage 20 further comprises a calibration unit 27, which receives at an input an activation signal En and a clock signal Ck, from a management unit (not illustrated) of the memory device 1, which supervises its general operation, determining among other things timing of the reading and programming operations. As described more fully in what follows, the calibration unit 27 comprises a calibration logic module 27a configured for generating at an output, as a function of the activation signal En and of the clock signal Ck, the update-enable signal Enup for the updating unit 26 and the driving-control unit 21, and moreover a drive-enable signal Endr designed to enable supply of the output driving currents Ik by the output driving unit 22. The calibration unit 27 further comprises a modification module 27b, which receives at an input the update-enable signal Enup from the calibration logic module 27a and moreover an error quantity ΔV from the driving-control unit 21, and is configured so as to generate at output the updating quantity IDCbias for the updating unit 26 and having a value that is a function of the error quantity ΔV.

As will be described in detail hereinafter, the error quantity ΔV is indicative of an error in the generation of the low-voltage control signal VgLV due to an unbalancing of the corresponding circuit, and the modification module 27b is configured to enable correction of this error by modification of the updating quantity IDCbias designed for updating the value of the shift voltage Vc on the level-shifter capacitor 25.

The driving stage 20 further comprises a feedback unit 28 having a first input connected to the second pin 25b of the level-shifter capacitor 25 and a second input receiving the boosted voltage Vcp from the charge-pump stage 24. The feedback unit 28 supplies at output a feedback quantity, for example, a feedback current If, to the driving-control unit 21 on the basis of which the driving-control unit 21 is able to check that the output driving current Ik reaches the desired value (implementing a feedback control closed loop). In particular, the value of the feedback current If represents only a small fraction of the output driving current Ik, for example, satisfying the relation: If=Ik/10.

Figure 6:
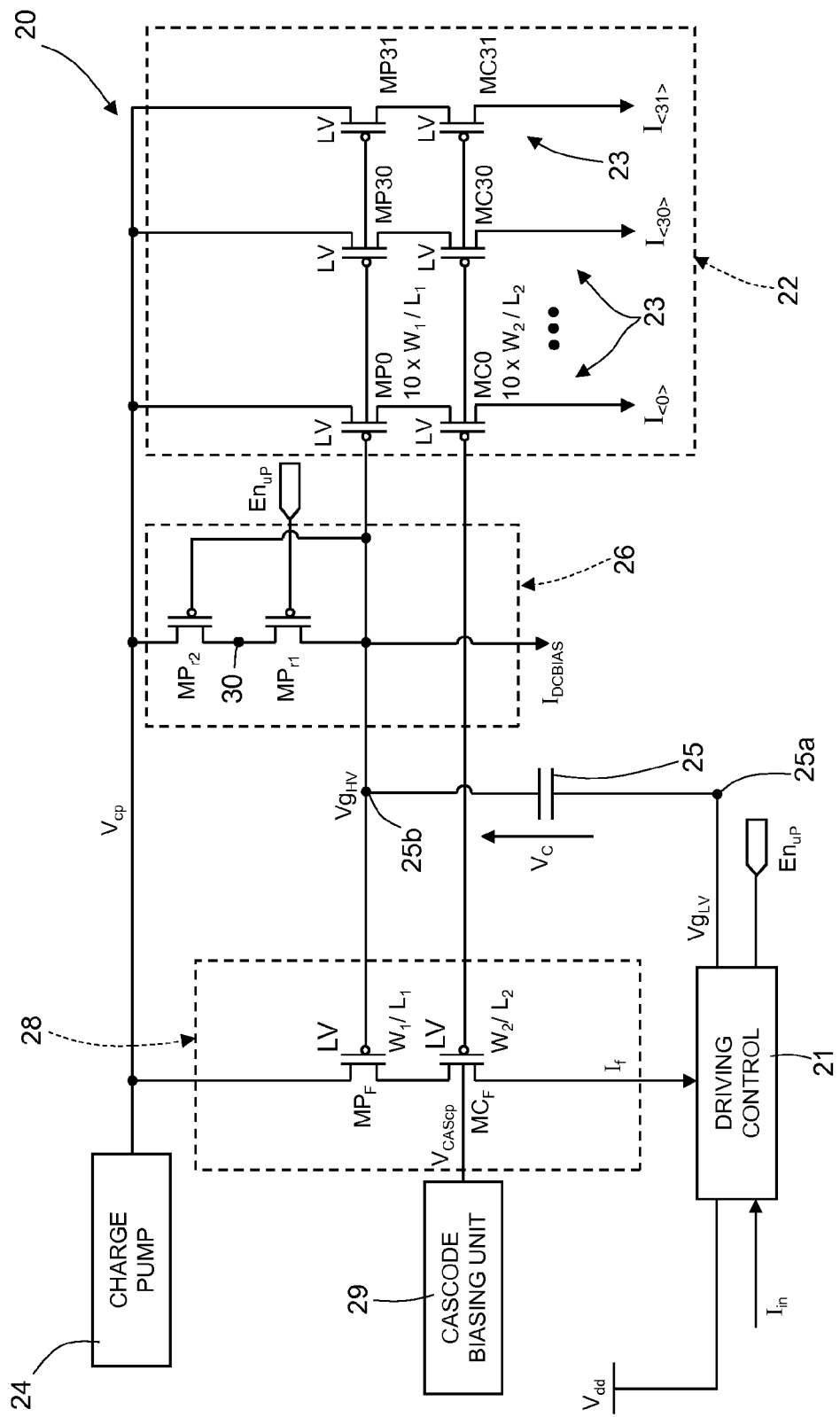
FIG. 6 is a schematic circuit diagram of a portion of the driving stage of FIG. 5.

A possible circuit embodiment of the driving stage 20 is now described in greater detail, except in regards to the driving-control unit 21 and the calibration unit 27, which will be described separately hereinafter, emphasizing in general the fact that for the implementation of the units and subunits listed previously, only low-voltage transistors are used (unlike what is used in known circuit approaches, for example, of the type described previously with reference to FIG. 3). As illustrated in FIG. 6, the output driving unit 22 comprises a plurality of driving subunits 23, numbering thirty-two in the illustrated example (and in any case corresponding to the total number of outputs of the driving stage 20 towards the column decoder 4 of the memory device 1, not illustrated herein), which are connected in parallel between the output of the charge-pump stage 24 and a respective output of the driving stage 20. Each driving subunit 23 comprises a respective cascode driving transistor MCk (with k in this case ranging from 0 to 31) and an output transistor MPk, both of a low-voltage PMOS type, connected in series and to a respective output of the driving stage 20, which supplies the respective output driving current Ik.

The control terminal of each cascode driving transistor MCk is connected to the output of a cascode biasing unit 29 (of a type in itself known and here not described in detail), which supplies an appropriate cascode biasing voltage Vcascp with a value such as to obtain a drain-to-source voltage VDS on the output transistors MPk that will enable operation in the saturation region. The control terminal of each output transistor MPk is, instead, connected to the second pin 25b of the level-shifter capacitor 25, and so receives the high-voltage control signal VgHV.

The updating unit 26 comprises a first refresh transistor MPr1, of a PMOS type, connected between the second pin 25b of the level-shifter capacitor 25 and an internal node 30, and having its control terminal receiving the update-enable signal Enup, and a second refresh transistor MPr2, which is also of a PMOS type, connected between the internal node 30 and the output of the charge-pump stage 24, and having its control terminal connected to the aforesaid second pin 25b of the level-shifter capacitor 25. The updating unit 26 receives the updating quantity IDCbias, in particular, a current of an appropriate value, at the second pin 25b of the level-shifter capacitor 25, in such a way that, based upon operating conditions, it will be supplied to the first refresh transistor MPr1.

During operation, an appropriate first value of the update-enable signal Enup (indicating the presence of a step of updating of the value of the shift voltage Vc), in the example a low value, causes the first and second refresh transistors MPr1, MPr2 to assume a diode configuration, substantially selectively creating a conductive path between the output of the charge-pump stage 24 and the second pin 25b of the level-shifter capacitor 25. In this configuration, the updating quantity IDCbias is a biasing current of the aforesaid diode, determining, with its value, the amount of the voltage drop across it.

Consequently, in the updating step, the value of the shift voltage Vc across the level-shifter capacitor 25 is appropriately updated to a desired value, substantially defined by the value of the boosted voltage Vcp, reduced by the voltage drop across the diode provided by the first and second refresh transistors MPr1, MPr2 (this value being a function of the updating quantity IDCbias) and by the voltage present on the first pin 25a of the level-shifter capacitor 25, determined, as described in detail hereinafter, by the driving-control unit 21 (operating in turn as a function of the value of the update-enable signal Enup).

In particular, it is once again emphasized that the value of the updating quantity IDCbias enables variation of the value of the shift voltage Vc and consequently of the value assumed by the high-voltage control signal VgHV in a subsequent operating step. When, in fact, the update-enable signal Enup has a second value, in the example, a high value, the voltage value on the second pin 25b of the level-shifter capacitor 25, corresponding to the value of the high-voltage control signal VgHV, is fixed by the value of the low-voltage control signal VgLV (which, in this step, is a function of the required input current Iin) and by the shift voltage Vc across the level-shifter capacitor 25 itself, the value of which has been previously appropriately updated. In this step, the first refresh transistor MPr1 is turned off by the update-enable signal Enup, thus disconnecting the second pin 25b of the level-shifter capacitor 25 from the output of the charge-pump stage 24.

The feedback unit 28 defines a substantially specular circuit branch mirrored with respect to each of the driving subunits 23, comprising, in fact, a cascode feedback transistor MCf and a feedback transistor MPf, both of a low-voltage PMOS type and connected in series between the output of the charge-pump stage 24 and the feedback input of the driving-control unit 21. The control terminal of the cascode feedback transistor MCf receives the cascode biasing voltage Vcascp from the cascode biasing unit 29 (in a way similar to each of the cascode biasing transistors MCk), and the control terminal of the feedback transistor MPf receives the high-voltage control signal VgHV since it is connected to the second pin 25b of the level-shifter capacitor 25 (in a way similar to each of the output transistors MPk).

In particular, the feedback transistor MPf has a first sizing ratio (width-to-length ratio) W1/L1 that is a fraction of the corresponding sizing ratio of each of the output transistors MPk (having, for example, a ratio that is ten times greater, 10·W1/L1). Likewise, the cascade feedback transistor MCf has a second sizing ratio W2/L2 that is equal to the same fraction of the corresponding sizing ratio of each of the output cascade transistors MCk (for example, having a ratio ten times greater, 10·W2/L2).

Figure 7:
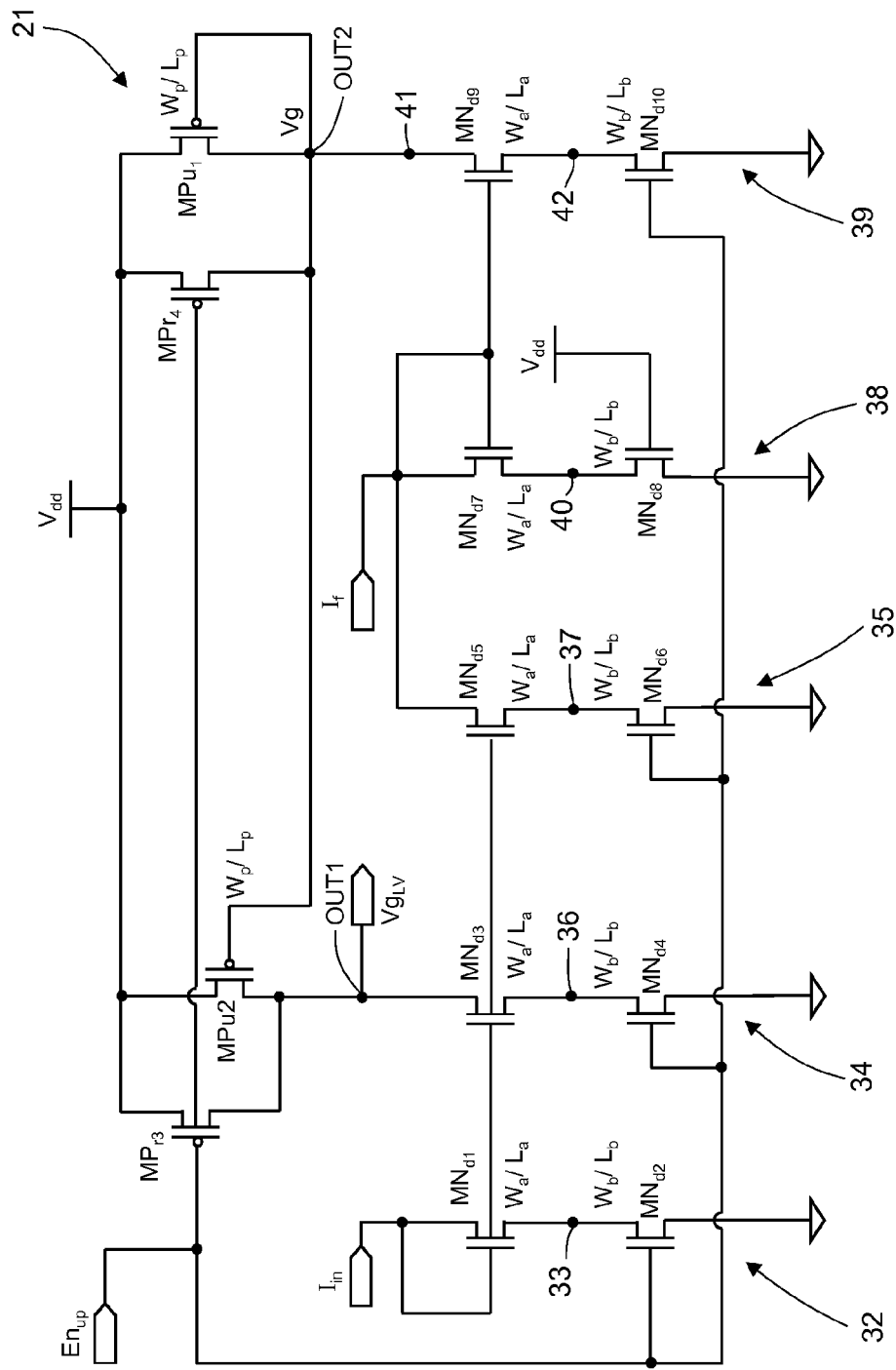
FIG. 7 is a schematic circuit diagram of a driving-control unit of the driving stage of FIG. 5.

In use, given the circuit configuration and the sizing of the components of the feedback unit 28, the feedback current If supplied to the feedback input of the driving-control unit 21 is automatically reduced, with respect to the output driving current Ik, by the same factor, once again designated by β, that links the sizing ratios of the aforesaid transistors, in the example a factor of ten, so that the relation Ik=β·If, with β=10, applies. The circuit configuration of the driving-control unit 21 is now described in greater detail, with reference to FIG. 7.

In general, the driving-control unit 21 comprises, using just low-voltage transistors, a transresistance current differential amplifier receiving at input the input current Iin and the feedback current If, and operating in such a way as to supply at output (in particular, at a high-impedance output) a value of the low-voltage control signal VgLV such that, in the condition of equilibrium, a desired relation between the values of the input current Iin and feedback current If applies (for example, in order to reduce as much as possible a difference or unbalancing between values associated thereto).

In particular, in the illustrated embodiment, the circuit configuration is such that the relation If=2·Iin applies. Consequently, the input current Iin and output driving current Ik are linked by the relation: Ik=2·β·Iin; where, as previously highlighted, the factor β is, for example, equal to 10.

In greater detail, the driving-control unit 21 comprises a first input branch 32 including: a first NMOS transistor MNd1, diode-connected between the input of the driving-control unit 21 that receives the input current Iin and a node 33, and a second NMOS transistor MNd2, connected in series to the first NMOS transistor MNd1, between the node 33 and the terminal at reference potential of the circuit, and having its control terminal that receives the update-enable signal Enup. The driving-control unit 21 further comprises a first output branch 34 and an internal comparison branch 35.

The first output branch 34, mirrored with respect to the first input branch 32, comprises: a third NMOS transistor MNd3, connected between a first output Out1 of the driving-control unit 21 that supplies the low-voltage control signal VgLV and a node 36, and having its control terminal connected to the control terminal of the first NMOS transistor MNd1; and a fourth NMOS transistor MNd4, connected in series to the third NMOS transistor MNd3, between the node 36 and the terminal at reference potential of the circuit, and having its control terminal that receives the update-enable signal Enup.

The internal comparison branch 35, which is also mirrored with respect to the first input branch 32, comprises: a fifth NMOS transistor MNd5, connected between the feedback input of the driving-control unit 21 that receives the feedback current If and a node 37, and having its control terminal connected to the control terminal of the first NMOS transistor MNd1; and a sixth NMOS transistor MNd6, connected in series to the fifth NMOS transistor MNd5, between the node 37 and the terminal at reference potential of the circuit, and having its control terminal that receives the update-enable signal Enup. The driving-control unit 21 further comprises a second input branch 38 and a second output branch 39.

The second input branch 38 comprises: a seventh NMOS transistor MNd7, diode-connected between the feedback input of the driving-control unit 21 that receives the feedback current If and a node 40; and an eighth NMOS transistor MNd8, connected in series to the seventh NMOS transistor MNd7, between the node 40 and the terminal at reference potential of the circuit, and having its control terminal connected to the voltage supply source that supplies the logic supply voltage Vdd.

The second output branch 39, mirrored with respect to the second input branch 38, in turn comprises: a ninth NMOS transistor MNd9, connected between a second output Out2 of the driving-control unit 21 that supplies a comparison signal Vg and a node 42, and having its control terminal connected to the control terminal of the seventh NMOS transistor MNd7; and a tenth NMOS transistor MNd10, connected in series to the ninth NMOS transistor MNd9, between the node 42 and the terminal at reference potential of the circuit, and having its control terminal that receives the update-enable signal Enup.

In particular, the first, third, fifth, seventh, and ninth NMOS transistors MNd1, MNd3, MNd5, MNd7, MNd9 have one and the same sizing ratio Wa/La, as likewise the second, fourth, sixth, eighth, and tenth NMOS transistors MNd2, MNd4, MNd6, MNd8, MNd10 have a respective same sizing ratio Wb/Lb. The driving-control unit 21 further comprises a first output transistor MPu1 and a second output transistor MPu2, of a PMOS type, and a third refresh transistor MPr3 and a fourth refresh transistor MPr4, which are also of a PMOS type.

The first output transistor MPu1 is diode-connected between the voltage supply source that supplies the logic supply voltage Vdd and the second output Out2 (the comparison signal Vg thus defining the voltage on the control terminal of the same first output transistor MPu1). The second output transistor MPu2 is connected between the voltage supply source that supplies the logic supply voltage Vdd and the first output Out1 and has its control terminal connected to the control terminal of the first output transistor MPu1. The first and second output transistors MPu1, MPu2 have one and the same sizing ratio Wp/Lp.

The third refresh transistor MPr3 is connected between the voltage supply source that supplies the logic supply voltage Vdd and the first output Out1 and has its control terminal that receives the update-enable signal Enup. The fourth refresh transistor MPr4 is connected between the voltage supply source that supplies the logic supply voltage Vdd and the second output Out2, and has also its control terminal that receives the update-enable signal Enup.

In use, and in a way that will be evident from an examination of the circuit described, during the normal operating mode (i.e., with the update-enable signal Enup having, in the example, a high value), a condition of substantial equilibrium tends to exist in the circuit, so that a current of a value substantially equal to the input current Iin circulates in the various circuit branches, these being made up of transistors with the same characteristics and biased in the same operating conditions. The feedback current If is twice the value of the input current Iin, given that both the internal comparison branch 35 and the second input branch 38 are connected to the same feedback input. In addition, in this condition of equilibrium, once again given the substantial circuit symmetry, the voltage value of the low-voltage control signal VgLV is substantially equal to the voltage value of the comparison signal Vg. It should be noted that, also on account of the feedback mechanism, the value of the low-voltage control signal VgLV varies in an appropriate way between 0 V and the value of the logic supply voltage Vdd in order to bring back the circuit into the condition of equilibrium. The value of the low-voltage control signal VgLV, after suitable level shifting by the level-shifter capacitor 25, then drives the control terminals of the output driving transistors, in order to obtain, in a situation of equilibrium, the desired value for the output driving current Ik (for example, in the case illustrated, Ik=2·β·Iin).

During the updating mode, instead, the low value of the update-enable signal Enup turns off the second, fourth, sixth, eighth, and tenth NMOS transistors MNd2, MNd4, MNd6, MNd8, MNd10 (and hence the amplifier itself) and turns on the third and fourth refresh transistors MPr3, MPr4, so that the low-voltage control signal VgLV, like the comparison signal Vg, is brought substantially to the value of the logic supply voltage Vdd. In this operating mode, as previously highlighted, the updating of the shift voltage Vc on the level-shifter capacitor 25 occurs, in the presence of a pre-set and controlled value of the low-voltage control signal VgLV (substantially coinciding with Vdd).

It has been noted that the theoretical operation previously described is verified when the variations required for the value of the low-voltage control signal VgLV are limited and such as to enable the circuit to be brought back into the condition of equilibrium. In the case, instead, where the requirements for the input current Iin are too high or too low (as compared to a previous operating condition), the shift required for the value of the low-voltage control signal VgLV may be too high and such as to bring the circuit to work in non-optimal conditions, i.e., out of the condition of equilibrium (basically, the various transistors in the circuit come to work outside the saturation condition, in linearity or in a triode condition). In this condition, a systematic error is thus determined on the value of the low-voltage control signal VgLV and consequently on the value of the output driving current Ik, which departs from the desired value.

The unbalancing of the circuit entails, in particular, the presence of a difference between the voltage values of the low-voltage control signal VgLV and of the comparison signal Vg. This difference defines the error quantity $\Delta V$ that is supplied at output by the driving-control unit 21 to the calibration unit 27, and the following relation applies:

$$\Delta V = VgLV - Vg.$$

In detail, it may be shown that, in the case of high current requirements, an error quantity $\Delta V$ of a negative value is determined, for example, smaller, or much smaller, than −0.1 V. Instead, in the case of low current requirements, an error quantity $\Delta V$ of a positive value is determined, for example, greater, or much greater, than 0.1 V. In either case (which can be, for example, expressed by the condition $|\Delta V|>0.1$ V), on account of the non-optimal operating condition, a systematic error between the two output branches of the circuit amplifier is caused.

In order to compensate for this systematic error, according to one aspect, the calibration unit 27 operates in such a way as to vary the value of the shift voltage Vc stored on the level-shifter capacitor 25 (by varying the updating quantity IDCbias) as a function of the amplitude of the error quantity $\Delta V$, so as to determine a shift of the value of the high-voltage control signal VgHV and hence reduce the variation required for the low-voltage control signal VgLV in the driving-control unit 21. In detail, the modification module 27b of the calibration unit 27 operates in such a way as to determine, as a function of the value of the error quantity $\Delta V$, a modification to be made to the value of the updating quantity IDCbias (as compared to a previous operating step), such as to update the value of the shift voltage Vc and bring the amplifier circuit of the driving-control unit 21 closer to the desired operating point, i.e. to the condition of equilibrium. The process of updating of the shift voltage Vc is repeated in an iterative way by successive approximations (each time modifying the present value of the updating quantity IDCbias with respect to a previous operating step), until, at least ideally, a condition of perfect equilibrium is reached, such as to set the error quantity $\Delta V$ to zero.

Figure 8:
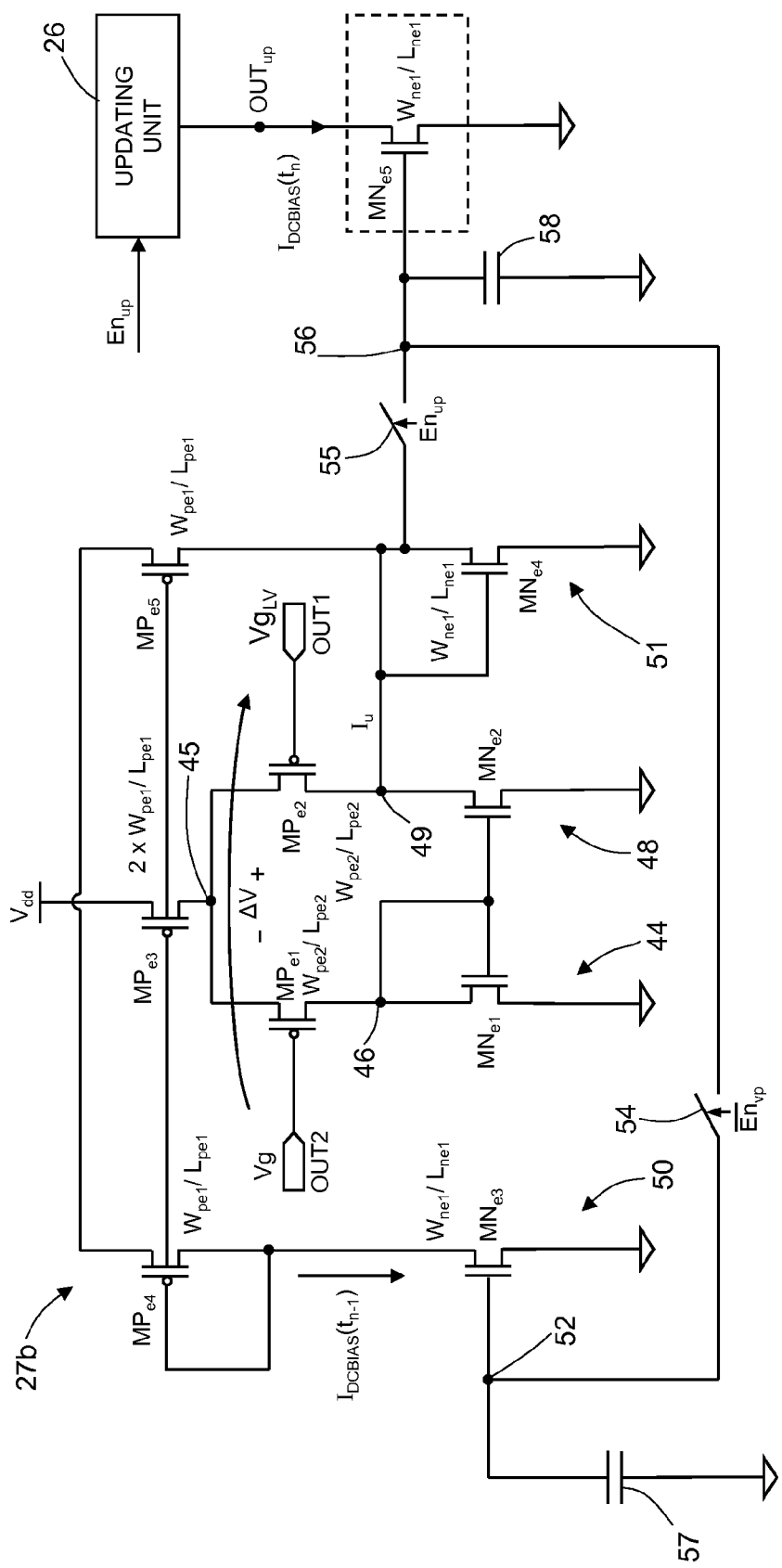
FIG. 8 is a schematic circuit diagram of a portion of a calibration unit of the driving stage of FIG. 5.

As illustrated in FIG. 8, the modification module 27b for this purpose has a differential input structure comprising a first differential input branch 44 including: a PMOS transistor MPe1, connected between the internal nodes 45 and 46, and having its control terminal connected to the second output Out2 of the driving-control unit 21 that receives the comparison signal Vg; and an NMOS transistor MNe1, diode-connected in series to the PMOS transistor MPe1, between the internal node 46 and the terminal at reference potential of the circuit.

A second differential input branch 48 of the differential input structure and mirrored with respect to the first may comprise: a PMOS transistor MPe2, connected between the internal node 45 and an internal node 49, and having its control terminal connected to the first output Out1 of the driving-control unit 21 that receives the low-voltage control signal VgLV; and an NMOS transistor MNe2, connected in series to the PMOS transistor MPe2, between the internal node 49 and the terminal at reference potential of the circuit, and having its control terminal connected to the control terminal of the NMOS transistor MNe1 of the first differential input branch 44.

The differential input structure further comprises a PMOS transistor MPe3, connected between an input receiving the logic supply voltage Vdd and the internal node 45, and designed to bias, in use, the first and second differential input branches 44, 48. The modification module 27b further comprises a reference branch 50 and an output branch 51.

The reference branch 50 comprises a PMOS transistor MPe4, in diode configuration, and by an NMOS transistor MNe3, connected in series between the input receiving the logic supply voltage Vdd and the terminal at reference potential. The control terminal of the PMOS transistor MPe4 is connected to the control terminal of the PMOS transistor MPe3, which is hence coupled thereto in current-mirror configuration, while the control terminal of the NMOS transistor MNe3 is connected to an internal node 52.

The output branch 51 comprises a PMOS transistor MPe5 and an NMOS transistor MNe4, the latter in diode configuration, connected in series between the input receiving the logic supply voltage Vdd and the terminal at reference potential. The control terminal of the PMOS transistor MPe5 is connected to the control terminal of the PMOS transistor MPe4, which is also coupled in current-mirror configuration, while the control terminal of the NMOS transistor MNe3 is connected to the internal node 49.

The modification module 27b further comprises: a first output switch 54 and a second output switch 55, which are set between the internal node 52 and, respectively, the internal node 49 and a regulation node 56 of the modification module 27b; and a first storage-capacitor element 57 and a second storage-capacitor element 58, connected between the internal node 52 and, respectively, the regulation node 56 and the terminal at reference potential. In particular, the first output switch 54 is controlled by the negated version of the update-enable signal Enup, while the second output switch 56 is controlled by the update-enable signal Enup itself (in such a way as to open/close upon closing/opening of the first output switch 56).

The modification module 27b further comprises an output refresh transistor MNe5, of an NMOS type, connected between the terminal at reference potential and an updating output Outup of the modification module 27b (corresponding to the output of the calibration unit 27 towards the updating unit 26), and having its control terminal connected to the regulation node 56, thus being selectively associated in current-mirror configuration with the NMOS transistor MNe4 (in the condition of closing of the second output switch 55). The current circulating in the NMOS transistor MNe5 represents the updating quantity IDCbias, supplied to the updating output Outup of the calibration unit 27.

In particular, the PMOS transistor MPe3 has a sizing ratio (2·Wpe1/Lpe1) equal to twice the corresponding sizing ratio of the PMOS transistors MPe4, MPe5, so as to supply on the internal node 45 a mirrored current of a value that is twice the current circulating in the reference branch 50 and in the output branch 51. The PMOS transistors MPe1, MPe2 have one and the same respective sizing ratio Wpe2/Lpe2, and moreover, the NMOS transistors MNe3, MNe4, MNe5 also have one and the same respective sizing ratio Wne1/Lne1.

In a first operating step, the update-enable signal Enup is high, thus determining de-activation of the updating unit 26 and of the operation of updating of the value of the shift voltage Vc. The first output switch 54 is open while the second output switch 55 is closed.

In this first operating step, given the circuit configuration described and the sizing ratios indicated, the current circulating in the NMOS transistor MNe4, which is mirrored with ratio 1:1 in the NMOS transistor MNe5, hence representing a present value of the updating quantity IDCbias(tn), has a value that is equal to the current circulating in the reference branch 50 reduced or increased by an unbalancing current, designated by Iu, which arrives at, or comes from, the internal node 49 and is a function of the unbalancing of the differential input structure and, hence, of the amplitude of the error quantity $\Delta V$. According to one aspect, moreover, the current circulating in the reference branch 50 represents a previous value of the updating quantity IDCbias(tn−1) so that in the aforesaid first operating step, the modification of the present value of the updating quantity IDCbias(tn) with respect to the previous value of the updating quantity IDCbias(tn−1) is determined, as a function of the error quantity $\Delta V$. In particular, when $\Delta V>0$ a decrease in the present value of the updating quantity IDCbias(tn) is determined, while when $\Delta V<0$ an increase of the present value of the updating quantity IDCbias(tn) is determined, with respect to the previous value IDCbias(tn−1).

In a second operating step, subsequent to the first operating step, the update-enable signal Enup is low, thus determining activation of the updating unit 26 and of the operation of updating of the value of the shift voltage Vc as a function of the present value of the updating quantity IDCbias(tn). The first output switch 54 is closed, while the second output switch 55 is open.

In this second operating step, as previously highlighted, the driving-control unit 21 is configured in such a way that the value of the low-voltage control signal VgLV, like the value of the comparison signal Vg, is substantially equal to the value of the logic supply voltage Vdd, so that the relation $\Delta V=0$ applies (the amplifier internal to the driving-control unit 21 is turned off). In this second operating step, updating of the current circulating in the reference branch 50 is thus determined, to the present value of the updating quantity IDCbias(tn), also thanks to the presence of the direct connection between the control terminals of the NMOS transistors MNe3, MNe5 created by closing of the first switch 54.

The aforesaid first and second operating steps hence repeat following one another (with a rate determined by the period of the update-enable signal Enup, in this case constituted by a train of pulses) for the entire duration of an updating time interval in which the activation signal En received at input by the calibration unit 27 remains at a first value (for example, high), so that the modification module 27b carries out, in an iterative way and by successive approximations, generation of an optimal value of the updating quantity IDCbias, such as to enable a value of the shift voltage Vc to be obtained that brings the system, and in particular the amplifier of the driving-control unit 21, to work in an optimal condition of substantial equilibrium between the internal circuit branches.

In particular, the fact that the modification of the present value of the updating quantity IDCbias(tn) is carried out, as a function of the error quantity $\Delta V$, starting from the previous value of the updating quantity IDCbias(tn−1) advantageously enables the updating process to converge effectively towards an optimal value of the shift voltage Vc (in relation to the current requirement at input). Within the same updating time interval, once a condition of substantial equilibrium has been reached, the operation of updating of the value of the shift voltage Vc enables in any case compensation of voltage drops across the level-shifter capacitor 25 and return thereof to, or maintenance thereof at, a desired value.

During the updating time interval, the drive-enable signal Endr generated by the calibration logic module 27a moreover disables supply of the output driving current Ik by the output driving unit 22. For example, PMOS enabling transistors may be provided for this purpose, set in series to the outputs that supply the output driving currents Ik, and controlled by the drive-enable signal Endr, possibly having a level suitably shifted by a level shifter. The feedback current If is, instead, in any case generated within the driving stage 21 in order to allow the operations of updating previously described.

Only at the end of the updating time interval, with the system brought back into the optimal operating condition (or in any case as close as possible to this condition), supply of the output driving current Ik is again enabled, for example, for carrying out a new SET or RESET programming operation in the addressed memory cells 3. In other words, the updating time interval (with the alternated repetition of the first and second updating operating steps, substantially corresponding to the low phase and, respectively, high phase of the pulses of the update-enable signal Enup generated by the calibration logic module 27a) is determined by the calibration logic module 27a, prior to execution of a new programming operation in such a way as to ensure execution of the programming operation in an optimal circuit condition and substantially without systematic errors.

Figure 9:
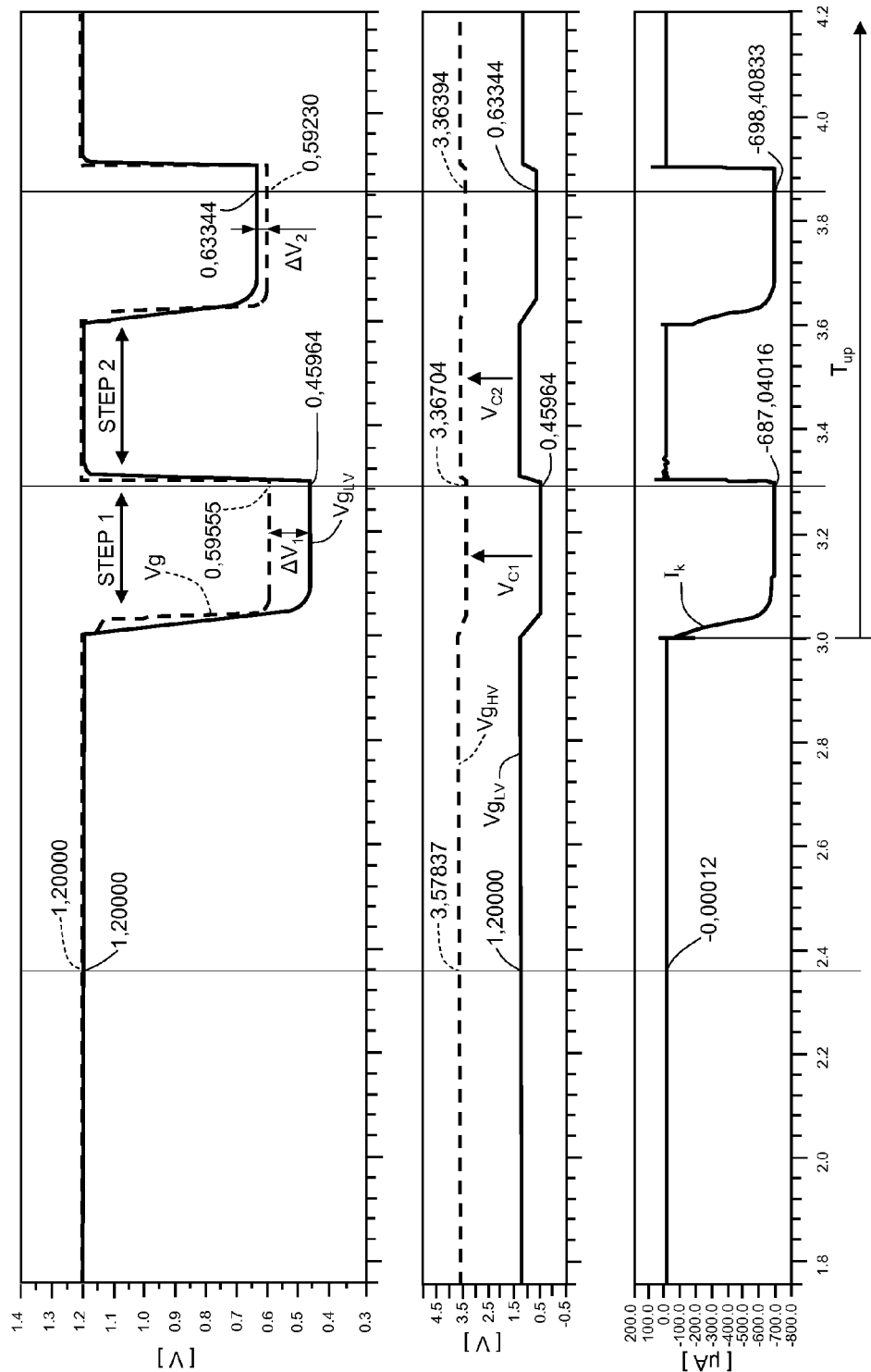
FIG. 9 is a timing diagram of electrical signals in the driving stage of FIG. 5.

In this regard, FIG. 9 shows the alternation, in an initial portion of the updating time interval, here designated by Tup, of a first updating operating step and a second updating operating step. In particular, in the first operating step (Step 1), a requirement of input current Iin for a subsequent programming step has a value such as to cause an evident unbalancing in the circuit, highlighted by a non-zero initial value $\Delta V1$ of the error quantity $\Delta V$; during the second operating step (Step 2), the value of the shift voltage Vc on the level-shifter capacitor 25 is thus updated (which passes from the value designated by Vc1 to the value designated by Vc2), and following upon this updating, the value of the error quantity, now designated by $\Delta V2$, drops, and the value of the biasing output current Ik approaches an effectively expected or desired value (in this case a value of 700 µA). It should be noted, in particular, that the substantial equality of the values of the low-voltage control signal VgLV and of the comparison signal Vg, in this case already after just one repetition of the aforesaid first and second operating steps (and a single iteration of the updating method). Obviously, according to the current requirement at the input and the consequent initial unbalancing of the circuit, a greater number of iterations may be required to reach the condition of substantial equilibrium.

The advantages of the driving stage according to the present embodiments are clear from the foregoing description. In any case, it is once again emphasized that the approach described may enable an optimal output linearity to be obtained in a wide range of variability of the required current (which, for example, encloses an entire decade, from 100 µA to 1000 µA), minimizing the errors. In particular, it has been verified that there is a possibility of reducing the systematic error to less than 1%.

This performance may be obtained by way of the auto-calibration feature of the circuit described, which is able to adapt automatically to the input-current requirements, bringing the working point into, or close to, the optimal condition of equilibrium. The fact of being able to prevent the use of a cascode configuration for very low values of the logic supply voltage Vdd affords a much faster response to the transients and an optimal stability.

In addition, it is possible to obtain an evident saving in the occupation of area required in the integrated implementation and a high efficiency in current consumption. In particular, it may be possible to obtain a savings in the occupation of area of even up to five times as compared to typical approaches, with an efficiency (evaluated as the ratio between the current supplied by the voltage-supply stage and the current supplied at output) lower than 1.2. In an evident way, the aforesaid savings in the consumption of area and current afford a corresponding saving in the manufacturing costs and in the operation of the memory device.

Finally, it is clear that modifications and variations may be made to what is described and illustrated herein, without thereby departing from the scope of the present embodiments, as defined in the annexed claims. In particular, it is evident that the phase change non-volatile memory device incorporating the biasing stage described may have a wide range of uses, amongst which are, for example, in microcontrollers, in applications with high safety requirements using smart cards with contact interface (such as PAYTV systems, SIMs, TPM modules) that have to satisfy the ETSI consumption specifications, and in contactless smart-card applications (RFIDs, NFCs, bank credit cards, etc.), where the memory module has a current budget limited by the system of energy harvesting (recovery of energy from the carrier) for all the operations (both writing operations and reading operations).

That which is claimed is:

1. A driving stage for a phase change non-volatile memory device comprising:
    an output driving unit configured to supply an output driving current during programming of at least one memory cell of the phase change non-volatile memory device;
    a driving-control unit configured to receive an input current, and to generate a first control signal to control supply of the output driving current by said output driving unit so that the output driving current has a desired relation with the input current;
    a level-shifter element coupled between said driving-control unit and said output driving unit, and configured to determine a shift voltage of the first control signal for supplying to said output driving unit a second control signal, the second control signal being increased with respect to and being a function of the first control signal; and
    a calibration unit configured to update the shift voltage as the input current varies.

2. The driving stage according to claim 1 wherein said calibration unit is configured to generate an updating value having a value based upon the input current; and further comprising an updating unit configured to receive the updating value and determine an update of the shift voltage as a function of the updating value to provide a desired operating point of said driving-control unit irrespective of the input current.

3. The driving stage according to claim 2 further comprising a feedback unit coupled to said output driving unit and configured to supply to said driving-control unit a feedback current corresponding to a desired fraction of the output driving current.

4. The driving stage according to claim 3 wherein said output-driving unit comprises a plurality of output branches configured to supply the output driving current on a respective output of said output driving unit; and wherein said feedback unit comprises a circuit branch mirrored with respect to said plurality of output branches with a mirroring factor so that the feedback current corresponds to the desired fraction of the output driving current.

5. The driving stage according to claim 3 wherein said driving-control unit comprises a differential current amplifier, said differential current amplifier comprising:
    first and second differential input branches configured to receive, respectively, the input current and the feedback current;
    a first output branch configured to generate the first control signal to obtain, in a condition of equilibrium, a pre-set ratio between the feedback current and the input current; and
    a second output branch, said calibration unit being configured to generate the updating value as a function of an imbalance error with respect to the condition of equilibrium in said differential current amplifier between said first output branch, associated to said first differential input branch, and said second output branch, associated to said second differential input branch.

6. The driving stage according to claim 5 wherein said level-shifter element comprises a capacitor element; wherein said updating unit comprises a selective conduction element configured to define a conductive path between a high-voltage pin of said capacitor element and a reference potential during the updating; wherein said driving-control unit is configured to supply the first control signal to a low-voltage pin of said capacitor element with a pre-set voltage value during the updating; and wherein said calibration unit is configured to supply the updating value to said updating unit on the high-voltage pin to determine a corresponding voltage drop on said selective conduction element.

7. The driving stage according to claim 6 wherein the updating value comprises a biasing current for said selective conduction element.

8. The driving stage according to claim 5 wherein said calibration unit is configured to generate the updating value iteratively and by successive approximations so that at each iteration, a present value of the updating value is modified with respect to a previous value of the updating value as a function of the imbalance error.

9. The driving stage according to claim 8 wherein said calibration unit is configured to:
    determine an updating time interval to control execution of the updating and disable supply of the output driving current by said output driving unit; and
    determine, during the updating time interval, a plurality of updating iterations, each iteration comprising
        modifying the present value of the updating value with respect to the previous value as a function of the imbalance error, and
        updating the shift voltage based upon the present value.

10. The driving stage according to claim 9 wherein the updating time interval corresponds to a time interval preceding the programming carried out on the at least one memory cell.

11. The driving stage according to claim 8 wherein said calibration unit comprises a circuit amplifier comprising:
    first and second differential input branches configured to receive the imbalance error;
    a reference branch configured to receive the previous value of the updating value in use; and
    an output branch coupled to said reference branch, and said first and second differential input branches to supply the present value of the updating value changed with respect to the previous value based upon the imbalance error.

12. The driving stage according to claim 1 wherein said output driving unit comprises a plurality of output transistors, each having a respective control terminal configured to receive the second control signal, and a respective conduction terminal configured to supply the output driving current on a respective driving output of said output driving unit.

13. The driving stage according to claim 1 further comprising a charge pump configured to generate a boosted voltage; wherein said driving-control unit has a supply-voltage input configured to receive a logic supply voltage being lower than the boosted voltage; wherein the first control signal has a threshold value less than or equal to the logic supply voltage; and wherein said level-shifter element is configured to generate the shift voltage so that the second control signal is greater than the logic supply voltage.

14. A phase change non-volatile memory device comprising:
    an array of memory cells; and
    a driving stage coupled to said array of memory cells and comprising
        an output driving unit configured to supply an output driving current during programming of at least one memory cell of said array thereof,
        a driving-control unit configured to receive an input current, and to generate a first control signal to control supply of the output driving current by said output driving unit so that the output driving current has a desired relation with the input current,
        a level-shifter element coupled between said driving-control unit and said output driving unit, and configured to determine a shift voltage of the first control signal for supplying to said output driving unit a second control signal, the second control signal being increased with respect to and being a function of the first control signal, and
        a calibration unit configured to update the shift voltage as the input current varies.

15. The phase change non-volatile memory device according to claim 14 wherein said array of memory cells comprises a plurality of bit lines; and further comprising a column decoder configured to select at least one bit line of said array of memory cells as a function of at least one address signal during the programming, said column decoder being coupled between said driving stage and said array of memory cells to receive the output driving current and supply it to the selected at least one bit lines.

16. The phase change non-volatile memory device according to claim 14 wherein said calibration unit is configured to generate an updating value having a value based upon the input current; and further comprising an updating unit configured to receive the updating value and determine an update of the shift voltage as a function of the updating value to provide a desired operating point of said driving-control unit irrespective of the input current.

17. The phase change non-volatile memory device according to claim 16 further comprising a feedback unit coupled to said output driving unit and configured to supply to said driving-control unit a feedback current corresponding to a desired fraction of the output driving current.

18. The phase change non-volatile memory device according to claim 17 wherein said output-driving unit comprises a plurality of output branches configured to supply the output driving current on a respective output of said output driving unit; and wherein said feedback unit comprises a circuit branch mirrored with respect to said plurality of output branches with a mirroring factor so that the feedback current corresponds to the desired fraction of the output driving current.

19. The phase change non-volatile memory device according to claim 17 wherein said driving-control unit comprises a differential current amplifier, said differential current amplifier comprising:
    first and second differential input branches configured to receive, respectively, the input current and the feedback current;
    a first output branch configured to generate the first control signal to obtain, in a condition of equilibrium, a pre-set ratio between the feedback current and the input current; and
    a second output branch, said calibration unit being configured to generate the updating value as a function of an imbalance error with respect to the condition of equilibrium in said differential current amplifier between said first output branch, associated to said first differential input branch, and said second output branch, associated to said second differential input branch.

20. The phase change non-volatile memory device according to claim 19 wherein said level-shifter element comprises a capacitor element; wherein said updating unit comprises a selective conduction element configured to define a conductive path between a high-voltage pin of said capacitor element and a reference potential during the updating; wherein said driving-control unit is configured to supply the first control signal to a low-voltage pin of said capacitor element with a pre-set voltage value during the updating; and wherein said calibration unit is configured to supply the updating value to said updating unit on the high-voltage pin to determine a corresponding voltage drop on said selective conduction element.

21. A method for calibration of a driving stage for a phase change non-volatile memory device, the driving stage comprising an output driving unit for supplying an output driving current during programming of at least one memory cell of the phase change non-volatile memory device, a driving-control unit receiving an input current, and generating a first control signal to control supply of the output driving current by the output driving unit so that the output driving current has a desired relation with the input current, a level-shifter element coupled between the driving-control unit and the output driving unit, and determining a shift voltage of the first control signal for supplying to the output driving unit a second control signal, the second control signal being increased with respect to and being a function of the first control signal, the method comprising:
    updating the shift voltage as the input current varies.

22. The method according to claim 21 wherein the updating includes generating an updating value having a value based upon the input current; and further comprising determining an update of the shift voltage as a function of the updating value to provide a desired operating point of the driving-control unit irrespective of the input current.

23. The method according to claim 22 wherein the driving stage further comprises a feedback unit coupled to the output driving unit and to supply to the driving-control unit a feedback current corresponding to a desired fraction of the output driving current.

24. The method according to claim 21 wherein the updating comprises updating iteratively and by successive approximations the shift voltage to obtain a desired operating point of the driving-control unit irrespective of the input current.

25. A method of making a driving stage for a phase change non-volatile memory device, the method comprising:
    coupling an output driving unit to supply an output driving current during programming of at least one memory cell of the phase change non-volatile memory device;

coupling a driving-control unit to receive an input current, and to generate a first control signal to control supply of the output driving current by the output driving unit so that the output driving current has a desired relation with the input current;

coupling a level-shifter element between the driving-control unit and the output driving unit, the level-shifter element to determine a shift voltage of the first control signal for supplying to the output driving unit a second control signal, the second control signal being increased with respect to and being a function of the first control signal; and coupling a calibration unit to update the shift voltage as the input current varies.

26. The method according to claim 25 wherein the calibration unit generates an updating value having a value based upon the input current; and further comprising coupling an updating unit to receive the updating value and determine an update of the shift voltage as a function of the updating value to provide a desired operating point of the driving-control unit irrespective of the input current.

27. The method according to claim 26 further comprising coupling a feedback unit to the output driving unit and to supply to the driving-control unit a feedback current corresponding to a desired fraction of the output driving current.

28. The method according to claim 27 wherein the output-driving unit comprises a plurality of output branches configured to supply the output driving current on a respective output of the output driving unit; and wherein the feedback unit comprises a circuit branch mirrored with respect to the plurality of output branches with a mirroring factor so that the feedback current corresponds to the desired fraction of the output driving current.

* * * * *